Dec. 3, 1968 S. L. BROADHEAD, JR 3,414,842
FREQUENCY MODULATED REFERENCE CONTROLLED OSCILLATOR
Filed Oct. 21, 1965

OPEN LOOP GAIN

CLOSED LOOP GAIN

INVENTOR.
SAMUEL L. BROADHEAD JR.
BY
Moody and Kintzinger
ATTORNEYS

United States Patent Office 3,414,842

Patented Dec. 3, 1968

3,414,842

FREQUENCY MODULATED REFERENCE CONTROLLED OSCILLATOR

Samuel L. Broadhead, Jr., Cedar Rapids, Iowa, assignor to Collins Radio Company, Cedar Rapids, Iowa, a corporation of Iowa Filed Oct. 21, 1965, Ser. No. 500,117
4 Claims. (Cl. 332—19)

ABSTRACT OF THE DISCLOSURE

A frequency modulated reference controlled oscillator circuit receiving an audio input signal and having its modulated signal output connected back through a signal divider circuit to a phase discriminator also receiving an input signal from a frequency reference signal source at a submultiple level from the center frequency of the variable oscillator in the circuit, and with a phase modulator included between the reference signal source and the phase discriminator, and connected through a 6 db per octave network to the audio input for frequency modulation from within to above the operational bandwidth of the loop.

Figure 1:
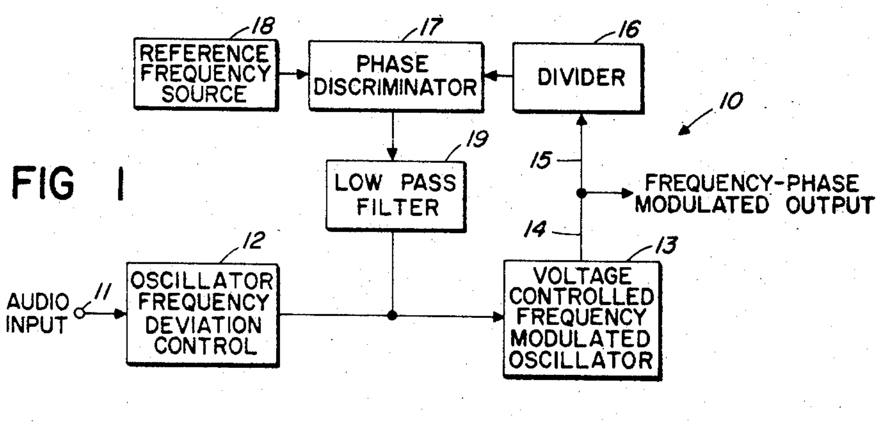

This invention relates in general to frequency modulated reference stabilized and controlled oscillator circuits, and in particular, to a frequency modulated oscillator circuit phase-locked to a submultiple frequency of the frequency modulated oscillator center frequency, and further to a frequency modulated oscillator capable of frequency modulation from within to above the operational bandwidth of the oscillator loop.

There are various frequency modulated stable master oscillator circuits with phase discriminator circuits in loops of the oscillators. However, most of these phase discriminators are incapable of maintaining phase lock in the oscillator circuits with phase excursions substantially over 0.2 radian, and certainly not with as great a phase excursion of as much, for example, as 10 radians. Further, it appears that the various existing frequency modulated reference controlled oscillators do not provide for attaining frequency modulation from within to above the operational bandwidth of the phase locked oscillator loop.

It is, therefore, a principle object of this invention to provide a frequency modulated reference controlled oscillator capable of maintaining the phase lock in the oscillator loop circuit through phase excursions from the oscillator center frequency greatly exceeding 0.2 radian and in some cases up to more than 10 radians.

A further object is to provide a frequency modulated reference controlled oscillator phase locked to a reference frequency source at a submultiple frequency of the frequency modulated oscillator center frequency.

Still another object with such a frequency modulated reference controlled oscillator, is to attain frequency modulation from within to above the operational bandwidth of the phase locked oscillator loop.

Features of this invention useful in accomplishing the above objects include, in a frequency modulated reference frequency stabilized and controlled oscillator circuit, a variable oscillator connected to receive an audio input signal and having modulated output means with a connection to a divider circuit. The circuits also include a phase discriminator connected to receive an output signal from the divider circuit and also an input from a reference source providing a frequency at a submultiple level from the center frequency of the variable oscillator, and with the phase discriminator circuit having an output connection through a low pass filter as an input to the variable oscillator. A further embodiment providing for frequency modulation from within to above the operational bandwidth of the loop also includes a phase modulator connected between the reference frequency source and the phase discriminator and a connection from the audio input line through a 6 db per octave network circuit as an input to the phase modulator. Further, amplitude versus frequency network circuitry may be provided in the audio input line for improving linearity of an oscillator frequency-phase modulation to audio input signal frequency variation.

Specific embodiments representing what are presently regarded as the best modes for carrying out the invention are illustrated in the accompanying drawing.

Figure 2:
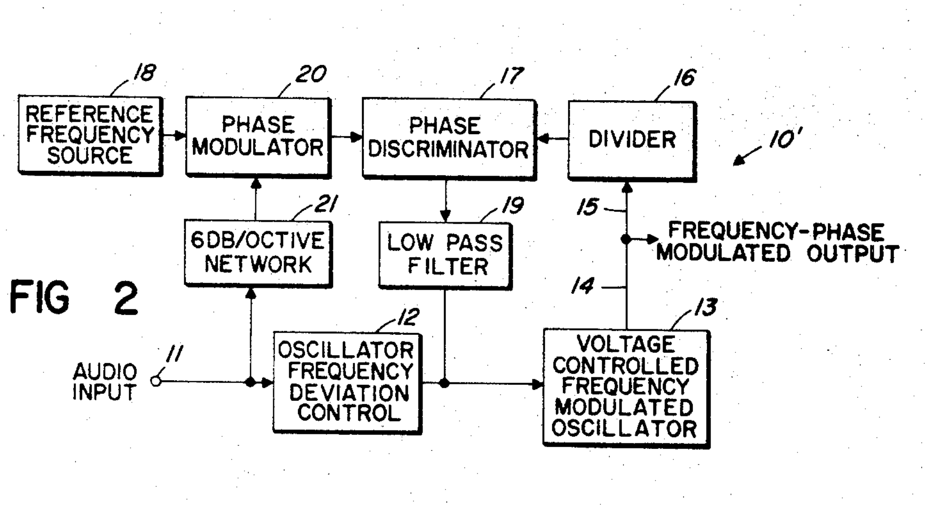
Figure 3:
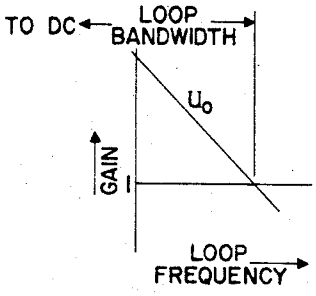
Figure 4:
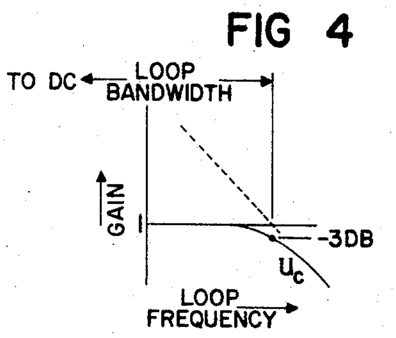

In the drawing:

FIGURE 1 represents a block diagram of a frequency-phase modulated oscillator phase locked to a reference frequency source at a submultiple frequency of the oscillator center frequency;

FIGURE 2, a block diagram of such an oscillator circuit constructed to provide for frequency-phase modulation from within to above the operational bandwidth of the phase locked oscillator loop;

FIGURE 3, a typical open loop gain-versus-loop frequency curve obtained with the embodiment of FIGURE 2; and FIGURE 4, a typical closed loop gain-versus-loop frequency curve with the embodiment of FIGURE 2.

Referring to the drawing:

The frequency modulated reference controlled oscillator circuit 10 of FIGURE 1 is shown to have an input connection from the audio input source terminal 11 through oscillator frequency deviation control network 12 to voltage controlled frequency modulated oscillator circuit 13 from which an output line 14 is provided for the output frequency phase modulated output signal. A branch connection 15 from line 14 is connected as an input to divider circuit 16, the output line connection of which is connected as an input line to phase discriminator circuit 17. Reference frequency source 18 also provides an output signal line connection connected as an additional input to phase discriminator 17. Phase discriminator 17 is also provided with an output line connection to and through low pass filter 19 as an additional input to the oscillator circuit 13.

This circuit provides a frequency modulated reference controlled oscillator with the center frequency of the oscillator 13 precisely controlled by the output frequency of the reference frequency source 18, which actually may be, for example, a highly stable crystal oscillator. The division ratio of divider circuit 16 is so chosen that the phase deviation of the frequency modulated oscillator 13 is divided to a value within the capability level of the phase discriminator to maintain phase lock in the circuit. For example, presuming that the required modulation index is 10, this meaning a phase excursion of 10 radians, it is a phase excursion requirement normally exceeding the phase lock maintaining capabilities of generally available phase discriminator circuits used in a conventional fashion. However, with the division of such a phase excursion of 10 radians by the factor of 100, then the 10 radian phase excursion is reduced to 0.1 radian excursion as sensed by phase discriminator 17, a phase excursion well within the phase lock capabilities of such a phase discriminator as generally used in a reference frequency stabilized and controlled oscillator circuit. It should be noted that an oscillator frequency deviation control circuit 12, while helpful in providing an improvement in constancy of the frequency deviation of the output signal at differing switch selected oscillator center frequencies, and corresponding switch selected division ratios, in divider 16, the circuit would still be a useful, workable circuit without such control circuitry present. Obviously, means for varying circuit values with a switching of the oscillator center frequencies is required such as by switch setting (detail not shown).

As a typical example, a working FIGURE 1 embodiment with the center frequency of modulated reference controlled oscillator 13 at 10 mc., and with a division ratio of 100 provided through divider circuit 16, the reference frequency source provides a stable reference frequency of 100 kc. In such a working embodiment with the voltage controlled frequency moduated oscillator maintained in phase lock through oscillator plus or minus phase excursions to approximately 10 radians, low pass filter circuit 19 passes up to approximately a 100 c.p.s. frequency signal. Hence, the oscillator may be modulated at any frequency above 100 c.p.s.

Referring now to the embodiment of FIGURE 2 components similar to those of the embodiment of FIGURE 1 are, for the sake of convenience, numbered the same. A phase modulator circuit 20 is interposed in the connection between the reference frequency source 18 and the phase discriminator 17, and a connection is provided from audio input terminal 11 through a 6 db per octave network circuit 21 as an input to phase modulator 20. With these additions to the circuit of FIGURE 1 the ability to modulate is extended to include frequencies within the loop bandwidth.

The two embodiments shown have many similarities to digital stabilized master oscillator circuits although application to applicant's concept are not necessarily limited to precisely that particular kind of stabilized master oscillators. Operation of the embodiment of FIGURE 2 in the stabilized master oscillator sense as it relates to applicant's teachings may be explained, at least to some considerable extent, by the following:

Open loop gain ($u_0$), without the effect of the low pass filter 19, as shown by FIGURE 3 is $$u_0=\frac{K_v K_\phi}{Nmf}$$

where $K_v$=pullability of the variable oscillator in c.p.s./volt,
$K_\phi$=output of phase discriminator 17 in volts/radian,
N=division ratio of divider circuit 16,
$m$=a gain reduction ratio by networks that may be employed for improved operation linearity and/or other desired results, although such networks are not detailed in the drawing, and
$f$=loop frequency in c.p.s.

Closed loop gain $u_c$ as shown by FIGURE 4, particularly when phase shift is low is:

$$u_c=\approx\frac{u_0}{1+|u_0|}$$

Thus, it may be seen that if $u_0$ is much greater than 1, and therefore $u_c$ approximately equal to 1, frequency modulation of the reference will be carried through to the variable oscillator, and on the other hand, if $u_0$ is much less than 1, $u_c$ will also be much less than 1, and frequency modulation of the reference will not be carried through to the variable oscillator. However, when $u_c$ is much less than 1, modulation of the voltage to the variable oscillator will not be corrected out. This can be more definitively explained by letting deviation (D) produced by modulating the reference with $u_c=1$, or by modulating the variable oscillator control voltage with $u_c=0$. Then, the deviation (D) of the variable oscillator 13, produced by modulating the reference frequency, will be simply $Du_c$, and the deviation produced by modulating the variable oscillator control voltage will be $D(1-u_c)$. The sum of these two components, when in phase, then will be: $Du_c+D-Du_c=D$, which is the desired operational result.

In referring to FIGURES 3 and 4, it might be noted that the gain axis is logarithmic and that the dotted line on FIGURE 4 represents the $u_0$ line of FIGURE 3 as it would be positioned relative to the closed loop gain $u_c$ curve in the graph of FIGURE 4.

Whereas, this invention is here illustrated and described with respect to several embodiments thereof, it should be realized that various changes may be made without departing from essential contributions to the art made by the teachings hereof.

I claim:

1. In a frequency modulated reference controlled oscillator circuit, a variable oscillator connected to an audio signal source to receive an audio input signal; said variable oscillator having modulated output means, said oscillator output means including a connection as a signal input to a divider circuit; a phase discriminator circuit connected to receive a first input from a reference frequency source and a second input from said divider circuit; with the phase discriminator circuit having output means connected through a low pass filter circuit as an input to the variable oscillator; wherein a phase modulator circuit is included between said reference frequency source and said phase discriminator circuit; and connective means is provided connected to the audio signal source and to said phase modulator, for providing an input to the phase modulator in addition to the reference frequency source input signal to the phase modulator.

2. The frequency modulated reference controlled oscillator circuit of claim 1 wherein a predetermined db value per octave circuit is included in the connective means interconnecting the audio signal source and said phase modulator.

3. The frequency modulated reference controlled oscillator circuit of claim 2, wherein the predetermined db value per octave circuit is approximately a 6 db per octave network circuit useful in open loop gain operation of the oscillator circuit within the circuit loop operational bandwidth; and where the closed loop gain frequency range characteristics of the oscillator circuit are limited by the predetermined frequency range of the low pass filter circuit, and are limited to effectiveness substantially only above the operational loop bandwidth.

4. The frequency modulated reference controlled oscillator circuit of claim 1, wherein the reference frequency source is chosen to provide a reference frequency at a submultiple frequency of a predetermined operational center frequency in the range of operation of the variable oscillator; and with the divider circuit constructed to provide a division ratio effective to transform the output signal frequency of said variable oscillator to approximately the same frequency as the reference frequency as the second input to the phase discriminator.

References Cited

UNITED STATES PATENTS 3,259,856 7/1966 Bott ---------------- 332—19

ROY LAKE, *Primary Examiner.*

LAWRENCE J. DAHL, *Assistant Examiner.*